(12) United States Patent
Song et al.

(10) Patent No.: US 8,058,187 B2
(45) Date of Patent: Nov. 15, 2011

(54) TRAP CHARGE EQUALIZING METHOD AND THRESHOLD VOLTAGE DISTRIBUTION REDUCING METHOD

(75) Inventors: Ki-whan Song, Yongin-si (KR); Su-a Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/652,052

(22) Filed: Jan. 5, 2010

(65) Prior Publication Data

US 2010/0173503 A1    Jul. 8, 2010

(30) Foreign Application Priority Data

Jan. 5, 2009    (KR) .......................... 10-2009-000416

(51) Int. Cl.
*H01L 21/30* (2006.01)

(52) U.S. Cl. ................. 438/795; 438/261; 257/E21.211

(58) Field of Classification Search .................. 438/261, 438/795

See application file for complete search history.

(56) References Cited

U.S. PATENT DOCUMENTS

| 5,895,274 A | 4/1999 | Lane et al. |
| 2005/0104119 A1* | 5/2005 | Diorio et al. .................. 257/315 |
| 2005/0237816 A1* | 10/2005 | Lue et al. ................. 365/185.28 |
| 2009/0032862 A1* | 2/2009 | Maayan et al. ............... 257/324 |

FOREIGN PATENT DOCUMENTS

| KR | 1020020084879 A | 11/2002 |
| KR | 1020060006119 A | 1/2006 |

* cited by examiner

*Primary Examiner* — Alexander Ghyka
(74) *Attorney, Agent, or Firm* — Volentine & Whitt, PLLC

(57) ABSTRACT

A method reduces a threshold voltage distribution in transistors of a semiconductor memory device, where each transistor includes a nitride liner. The method includes injecting electrons into a charge trap inside and outside the nitride liner of the transistors, and partially removing the electrons injected into the charge trap inside and outside the nitride liner to equalize trapped charges in the transistors.

5 Claims, 12 Drawing Sheets

TRAP CHARGE EQUALIZING METHOD AND THRESHOLD VOLTAGE DISTRIBUTION REDUCING METHOD

CROSS-REFERENCE TO RELATED APPLICATIONS

A claim of priority is made to Korean Patent Application No. 10-2009-0000416, filed on Jan. 5, 2009, in the Korean Intellectual Property Office, the disclosure of which is incorporated herein in its entirety by reference.

BACKGROUND

The inventive concepts described herein generally relate to semiconductor memory devices which include transistors containing a nitride liner between a gate and source/drain regions.

Generally, the transistors of such devices, such as DRAM (dynamic random access memory) devices, disadvantageously exhibit a wide threshold voltage distribution of such devices.

The inventive concepts described herein more particularly relate to methods for equalizing trap charges in semiconductor memory device transistors, thereby reducing the threshold voltage distribution of the transistors.

According to an aspect of the inventive concepts, a method is provided for reducing a threshold voltage distribution in transistors of a semiconductor memory device, where each transistor includes a nitride liner. The method includes injecting electrons into a charge trap inside and outside the nitride liner of the transistors, and partially removing the electrons injected into the charge trap inside and outside the nitride liner to equalize trapped charges in the transistors.

According to another aspect of the inventive concepts, a method is provided for reducing the distribution of threshold voltages of a plurality of transistors of a semiconductor memory device including a shallow trench isolation (STI) structure comprising a nitride liner. The method includes selecting transistors that are positioned in a region where acceptor segregation has occurred from among the plurality of transistors, and injecting electrons to a trap inside and outside the nitride liner of the selected transistors. A quantity of injected electrons is increased with an increased occurrence of the acceptor segregation among at least one of the selected transistors.

BRIEF DESCRIPTION OF THE DRAWINGS

The above and other aspects of the inventive concepts will become readily apparent from the detailed description that follows, with reference to the accompanying drawings, in which.

DETAILED DESCRIPTION OF EMBODIMENTS

Figure 1A:
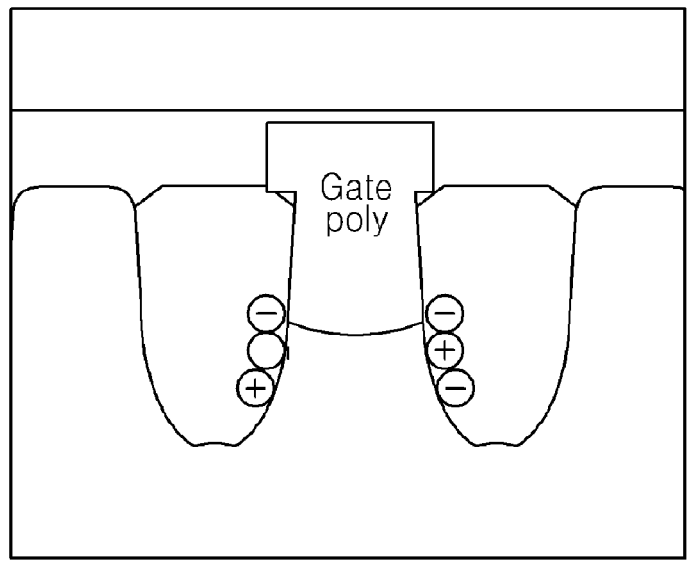
FIGS. 1A, 2A and 3A are schematic cross-sectional views of a transistor of a semiconductor memory device having different charge trap states according to an embodiment of the inventive concepts.

The attached drawings for illustrating exemplary embodiments of the inventive concepts are referred to in order to gain a sufficient understanding of the inventive concept, the merits thereof, and the objectives accomplished by the implementation of the inventive concepts.

Hereinafter, the inventive concepts will be described in detail by explaining exemplary embodiments of the inventive concepts with reference to the attached drawings. Like reference numerals in the drawings denote like elements.

A trap charge equalizing method (or, a threshold voltage distribution reducing method) according to one or more embodiments of the inventive concepts includes an electron injecting operation and a purge operation. The electron injecting operation involves injecting electrons into a trap inside and outside a nitride liner of transistors included in a semiconductor memory device. The purge operation involves partially removing the electrons that are injected into the trap inside and outside the nitride liner.

The trap charge equalizing method may, for example, be applied to a shallow trench isolation (STI) structure including a nitride liner. Also, the trap charge equalizing method may, for example, be applied to a dynamic random access memory (DRAM) based on a recess-channel-array transistor (RCAT)/sphere-shaped-recess-channel-array transistor (SRCAT).

The trap charge equalizing method may, for example, be performed in an electrical die sorting (EDS) process after output fabrication (FAB-OUT) in a semiconductor memory device manufacturing process.

FIGS. 1A through 3B are diagrams for describing a trap charge equalizing method according to an embodiment of the inventive concepts.

FIG. 1A is a schematic diagram of an initial state of a transistor device according to an embodiment of the inventive concepts. The transistor device includes a semiconductor substrate (SUB) with one or more interlayer insulating layers stacked thereon. Source/drain regions are located in the substrate, and a polysilicon gate (Gate poly) is located on the substrate and extends between the source/drain regions.

Further, a nitride liner is located between each source drain region and the substrate and polysilicon gate. For example, the nitride liner may form an O—N—O structure, as the $SiO_2$, $SiN_4$, $SiO_2$ layered structure represented by the energy diagram of FIG. 1B.

Figure 1B:
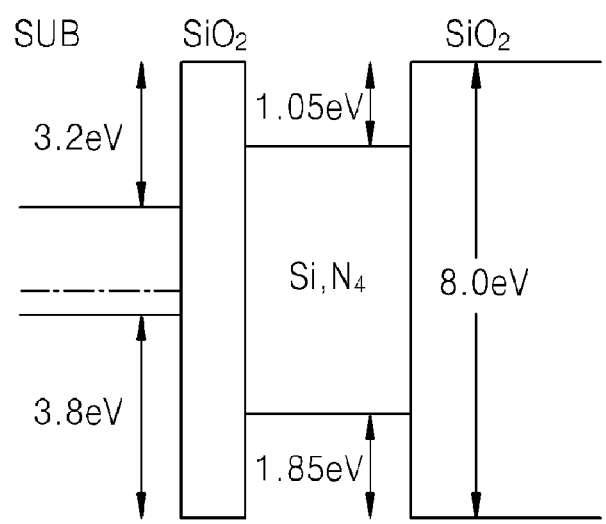
FIGS. 1B, 2B and 3B are energy diagrams corresponding to respective FIGS. 1A, 2A and 3A.

In the initial state of FIG. 1A, electrons and holes co-exist inside and outside the nitride liner. FIG. 1B illustrates examples of energy levels of the initial state of FIG. 1A. As is apparent from FIG. 1B, a charge trap is formed by the nitride liner.

Figure 2A:
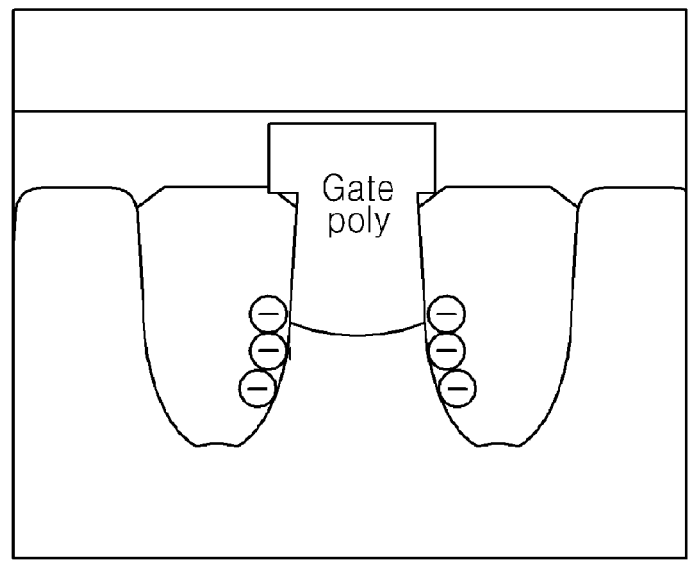
Figure 2B:
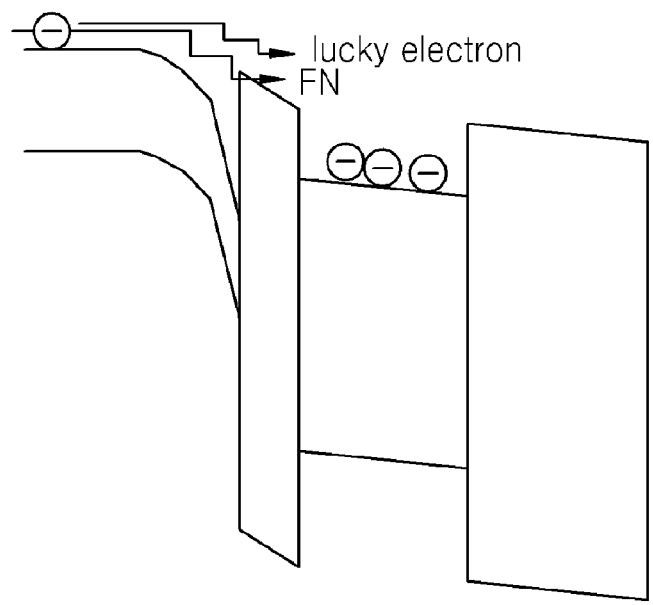

FIG. 2A illustrates a charge trap state after electrons are injected to a trap inside and outside the nitride liner (the charge injecting operation). FIG. 2B is a diagram for describing a process of injecting the electrons.

In the process of injecting the electrons, channel initiated secondary electrons (CHISELs) or GIDL induced secondary electrons (GISELs) may be injected to the trap. In addition, hot electron injection or a Fowler-Nordheim (FN) electron injection may be used. The process of injecting the electrons will be described later.

Figure 3A:
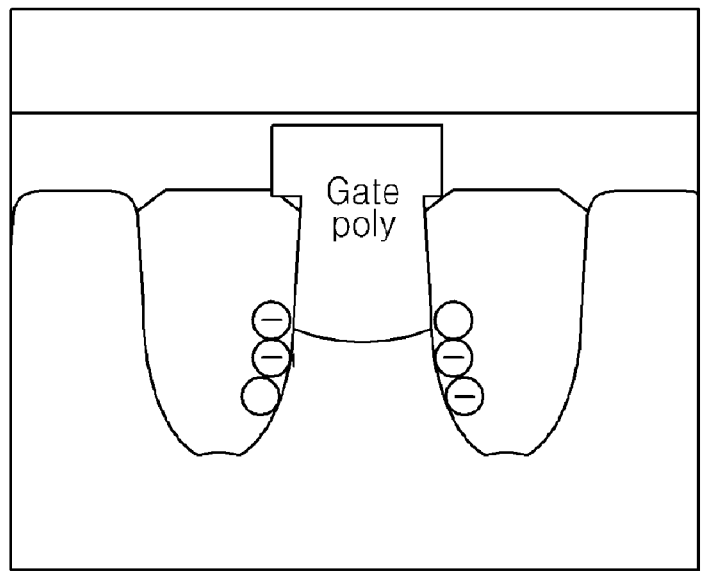

FIG. 3A illustrates a state of the trap after the electrons that are injected to the trap inside and outside the nitride liner are partly removed (the purge operation).

In a process of removing the electrons (the purge operation), ultraviolet (UV) rays may be irradiated to the trap or heat may be applied to the trap. In the process of removing the electrons (the purge operation), electrons that have been injected to a shallow trap may be removed, or electrons that are naturally to be emitted to the outside at a later time may be previously removed.

In this manner, by performing the charge injecting operation and the purge operation, the threshold value distribution of transistors may be reduced.

Figure 4:
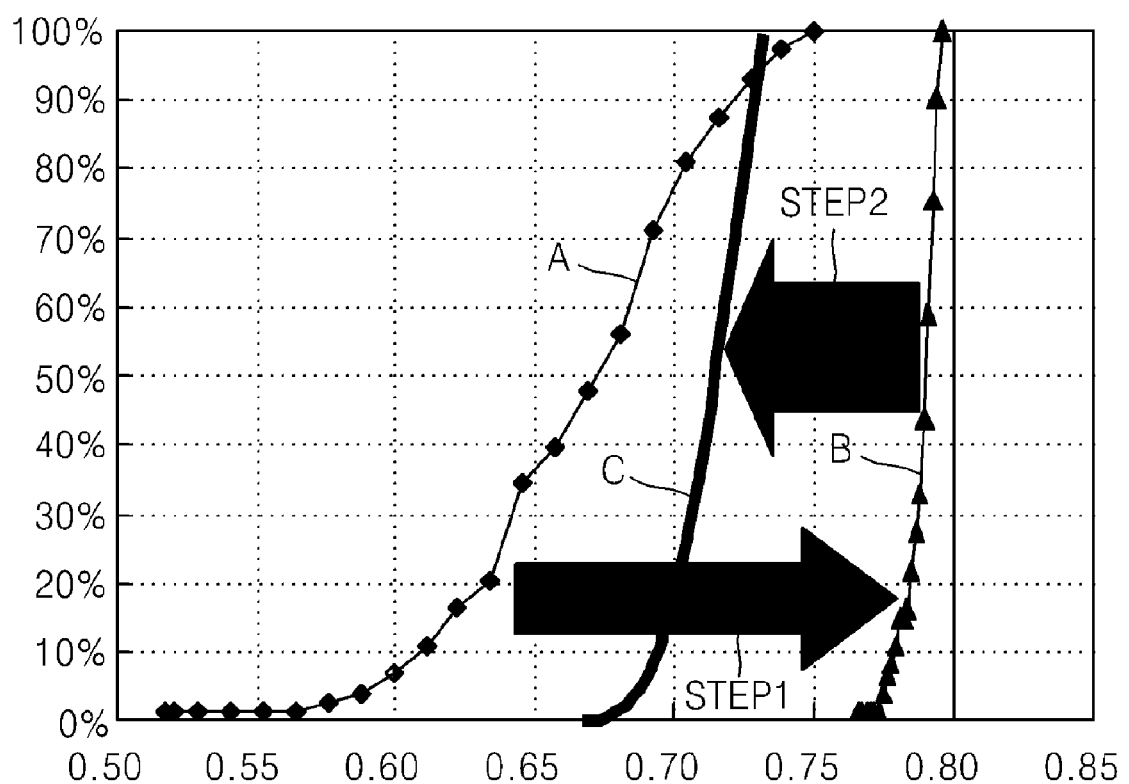
FIG. 4 is a graph showing a reduction in threshold voltage distribution of transistors according to an embodiment of the inventive concepts.

FIG. 4 is a graph showing the reduction of threshold voltage distribution of transistors.

Figure 3B:
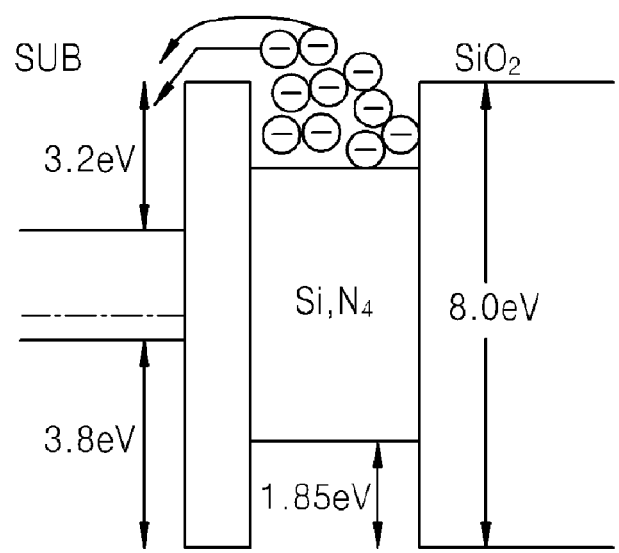

Referring to FIG. 4, a curve A shows the threshold voltage distribution of the transistors at the initial state (FIGS. 1A and 1B), a curve B shows the threshold voltage distribution of the transistors after the charge injecting operation is performed (FIGS. 2A and 2B), and a curve C shows the threshold voltage distribution of the transistors after the purge operation is performed (FIGS. 3A and 3B).

Since the electrons have been injected to the trap of the nitride liner, a threshold voltage of the transistors is increased after the charge injecting operation, compared to the initial state (compare curve A and curve B). Next, since the electrons of the trap of the nitride liner have partly been removed in the purge operation, the threshold voltage of the transistors is reduced after the purge operation, compared to the charge injecting operation (compare curve B and curve C). Also, it is evident that the threshold voltage distribution of the transistors after the purge operation (see curve C) is reduced, compared to the threshold voltage distribution of the transistors at the initial state (see curve A).

Figure 5A:
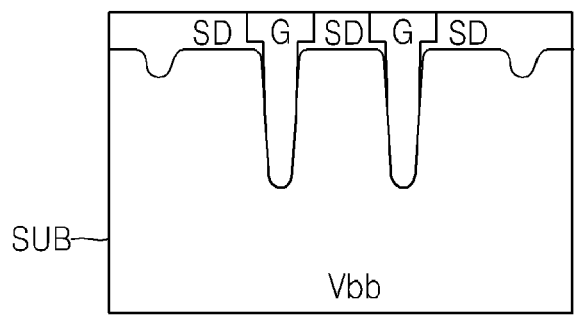
FIGS. 5A through 5D are schematic cross-sectional diagrams for describing a trap charge equalizing method using channel initiated secondary electrons (CHISELs), according to another embodiment of the inventive concepts.
Figure 5B:
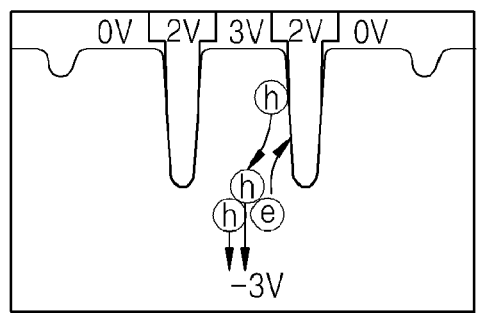
Figure 5C:
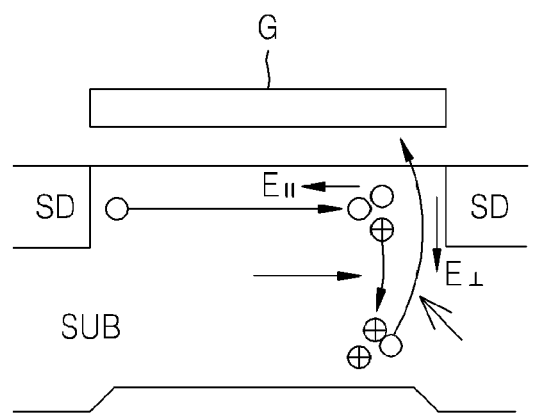
Figure 5D:
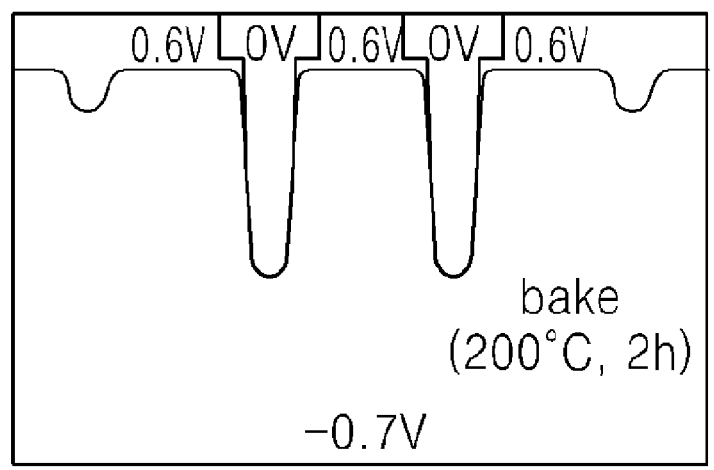

FIGS. 5A through 5D are diagrams for describing a trap charge equalizing method involving using CHISELs, according to another embodiment of the inventive concepts. In FIGS. 5A, 5B and 5D, the curved lines below "G" denote the boundary between the gates and the substrate, and the lines below SD denoted the boundary between the source/drain and the substrate.

FIG. 5A illustrates an initial state of the transistors.

FIG. 5B illustrates an electron injecting operation using the CHISELs.

Referring to FIG. 5B, −3V is applied to the substrate SUB, 2V is applied to a gate G, and 0V and 3V are respectively applied to source SD and drain SD. Accordingly, holes move toward the substrate SUB, and electrons move toward the gate G to which 2V is applied. Here, the electrons correspond to the CHISELs.

FIG. 5C is a diagram for describing in detail a process of FIG. 5B.

A horizontal electric field that is formed by an electrical potential difference between the source SD and the drain SD functions to perform the initiation in the charge injecting operation. The horizontal electric field indicates an electric field that is parallel with a flow of electrons in a channel direction. The electrons that are injected from the source SD to the drain SD by the horizontal electric field collide with ions in the drain SD, thereby making electron-hole pairs. Meanwhile, when a negative voltage is applied to the substrate SUB, a vertical electric field is formed, and in this respect, the hole from an electron-hole pair is accelerated toward the substrate SUB by the vertical electric field. In this process, an electron-hole pair is secondarily made, and the electron from the electron-hole pair that is secondarily made is accelerated toward the drain SD and the gate G by the vertical electric field. In this process, some of the electrons may pass through an energy barrier between the substrate SUB and a gate dielectric layer and then may be trapped to a nitride film (referred to as a lucky electron in FIG. 2B).

FIG. 5D illustrates a purge operation using heat.

Referring to FIG. 5D, e.g., heat of 200° C. is applied to the transistors for two hours. Accordingly, electrons that have been injected to a shallow trap may be removed, or electrons that are naturally to be emitted to the outside at a later time may be previously removed. In the purge operation, an appropriate voltage may be used, e.g., −0.7V may be applied to the substrate SUB, 0V may be applied to the gate G, and 0.6V may be applied to the source and drain SD.

The purge operation may also be performed to partly remove the electrons by irradiating UV rays to the transistors other than the application of heat.

Figure 6:
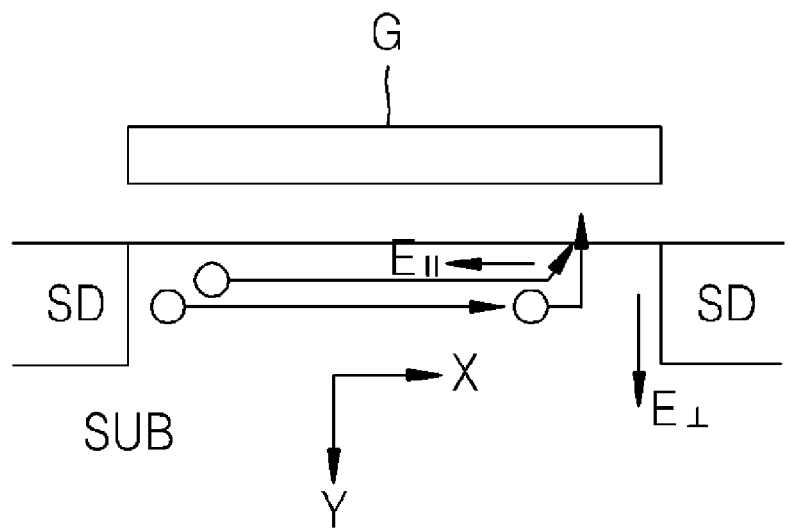
FIG. 6 illustrates an electron injecting operation using hot electrons according to an embodiment of the inventive concepts.

FIG. 6 illustrates an electron injecting operation using hot electrons.

Referring to FIG. 6, in order to induce the hot electrons, a high voltage is applied to a gate electrode G, and an electrical potential difference is formed between the source SD and the drain SD. Accordingly, the hot electrons are generated in a channel region adjacent to the source and drain SD. Such hot electrons pass through an energy barrier between the substrate SUB and a tunnel dielectric layer (that is formed between the gate electrode G and the channel) and then are injected to the trap.

Figure 7A:
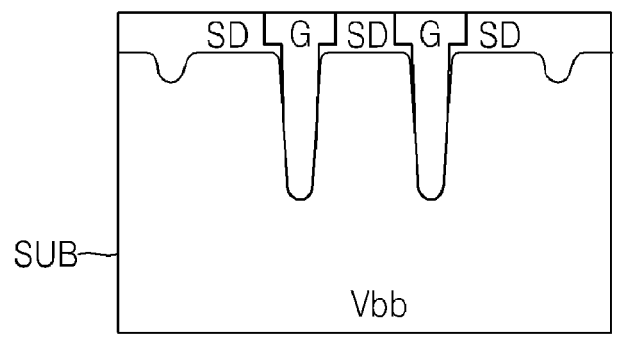
FIGS. 7A through 7C are diagrams for describing a trap charge equalizing method using GIDL induced secondary electrons (GISELs), according to another embodiment of the inventive concepts.
Figure 7B:
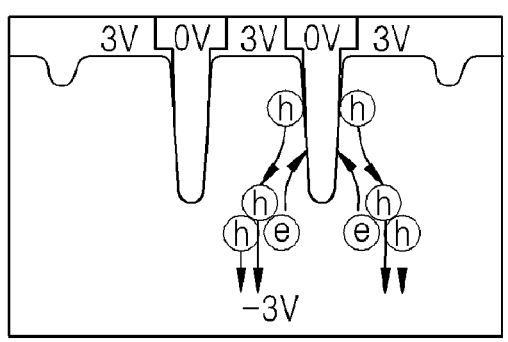
Figure 7C:
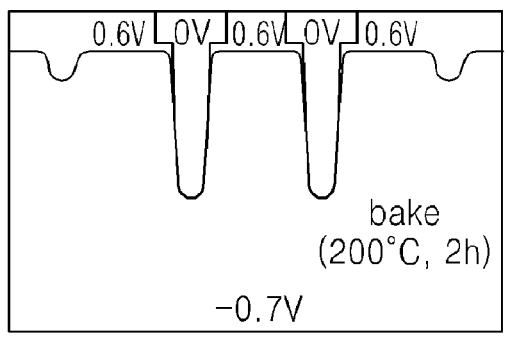

FIGS. 7A through 7C are diagrams for describing a trap charge equalizing method involving using GISELs, according to another embodiment of the inventive concepts.

FIG. 7A illustrates an initial state of the transistors.

FIG. 7B illustrates an electron injecting operation using the GISELs.

Referring to FIG. 7B, −3V is applied to the substrate SUB, 0V is applied to a gate G, and 3V are applied to source SD and drain SD, respectively. Accordingly, holes that flow into the substrate SUB by a gate induce drain leakage (GIDL) are accelerated toward the substrate SUB by a vertical electric field that is formed by the voltage of the substrate SUB, and then secondarily make an electron-hole pair. The electron from the electron-hole pair is accelerated toward the drain SD and the gate G by the vertical electric field. In this process, some of electrons may pass through an energy barrier between the substrate SUB and a gate dielectric layer and then may be trapped to a nitride film (a nitride liner).

FIG. 7C illustrates a purge operation using heat.

The purge operation with reference to FIG. 7C is similar to the purge operation described with reference to FIG. 5D, and thus a detailed description thereof is omitted here. As described with reference to FIG. 5D, the purge operation may also be performed to partially remove the electrons by irradiating UV rays to the transistors, or by application of heat.

In addition to the electron injecting operation described in relation to FIGS. 5A through 7C, the electrons may be injected to the trap by using FN electron injection. When a positive voltage is applied to a gate electrode, a FN tunnelling current is generated in an entire region of a tunnel dielectric layer, and due to the FN tunnelling current, the electrons may be injected to the trap. For this, a negative voltage may be applied to a drain, a source or a substrate.

Bias conditions are not limited to the specific examples illustrated in FIGS. 5A through 7C and may vary.

The transistors may be disposed in a core region of the semiconductor memory device, or may be disposed in a peripheral region of the semiconductor memory device.

Figure 8:
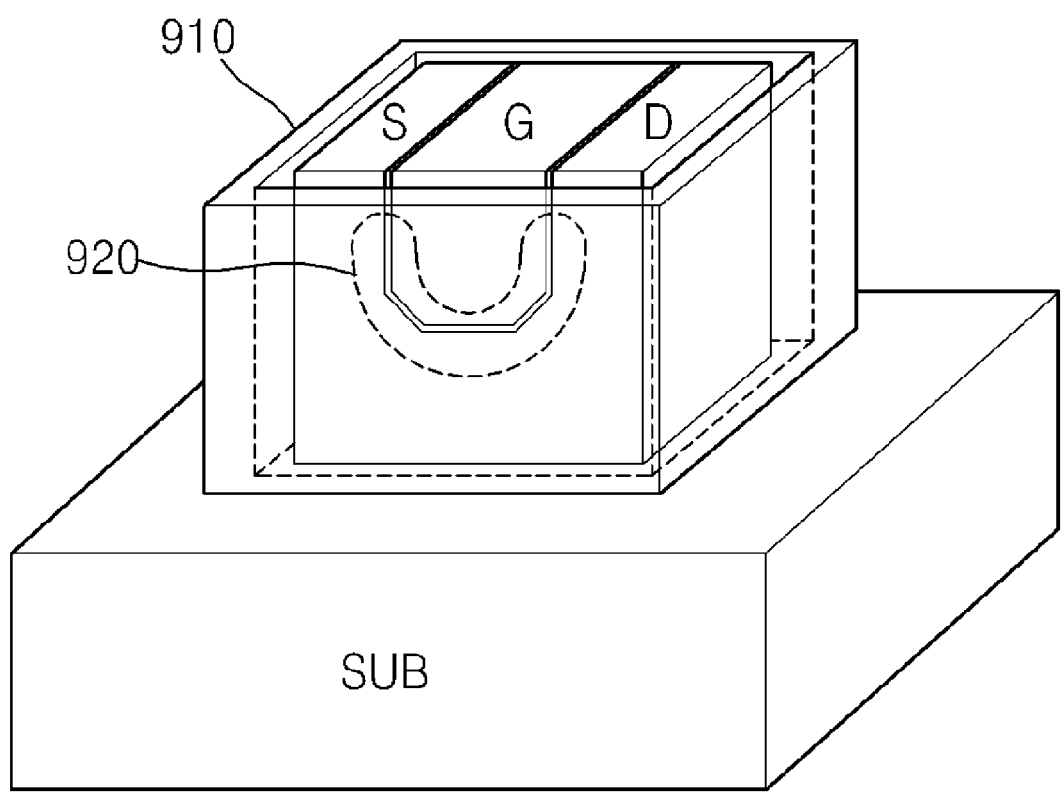
FIG. 8 is a perspective view of a shallow trench isolation (STI) structure including a nitride liner.

FIG. 8 is a perspective view of a STI structure including a nitride liner 910.

Referring to FIG. 8, the STI structure includes a trap region 920 where a trap mainly occurs.

Figure 9A:
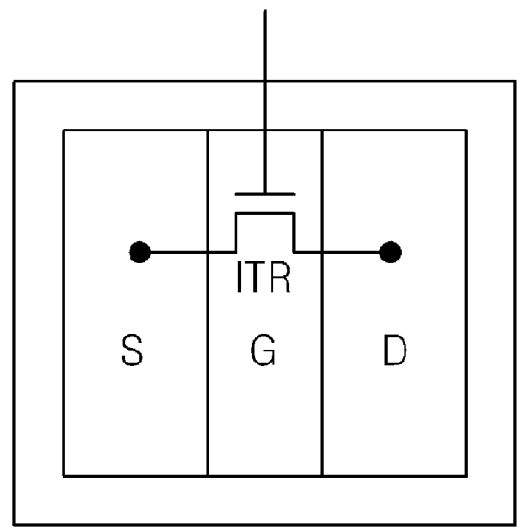
FIG. 9A is a schematic diagram of an ideal cell transistor formed in the STI structure of FIG. 8.

FIG. 9A is a diagram of an ideal cell transistor formed in the STI structure of FIG. 8. In FIG. 9A, one transistor is illustrated, and this means that the transistors formed in the STI structure have a same threshold voltage in all regions.

Figure 9B:
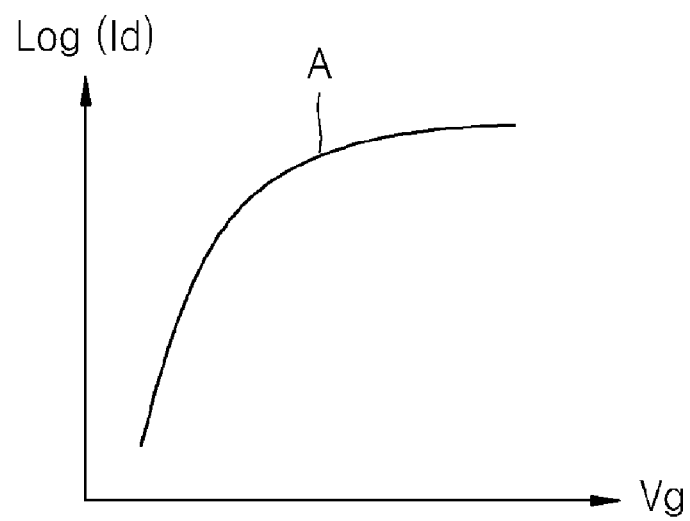
FIG. 9B is a graph showing a threshold voltage distribution of the ideal cell transistor in FIG. 9A.

FIG. 9B is a graph showing threshold voltage distribution of the ideal cell transistor in FIG. 9A.

Figure 10A:
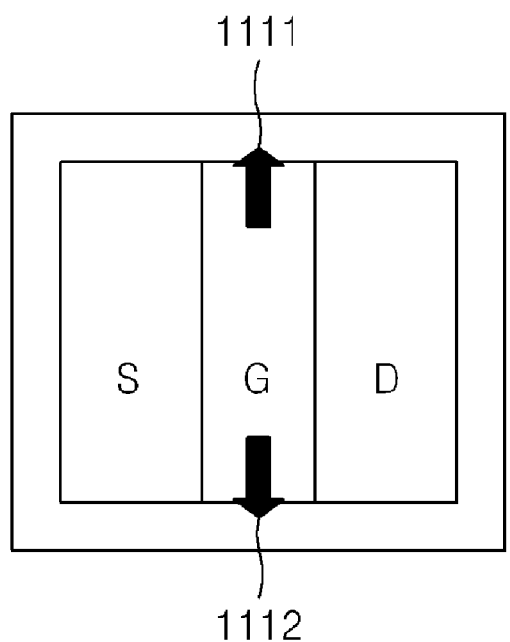
FIG. 10A illustrates a boron segregation that occurs in the STI structure of FIG. 8.

FIG. 10A is a diagram illustrating a boron segregation that occurs in the STI structure of FIG. 8. Two arrows 1111 and 1112 illustrated in FIG. 10A indicate that the Boron segregation occurs at a relatively high rate at the edges of the STI structure. Thus, there is a problem in that a threshold voltage is significantly reduced at the edges. Although boron is described as an example of the detailed description, an acceptor other than boron may be used as an example.

Figure 10B:
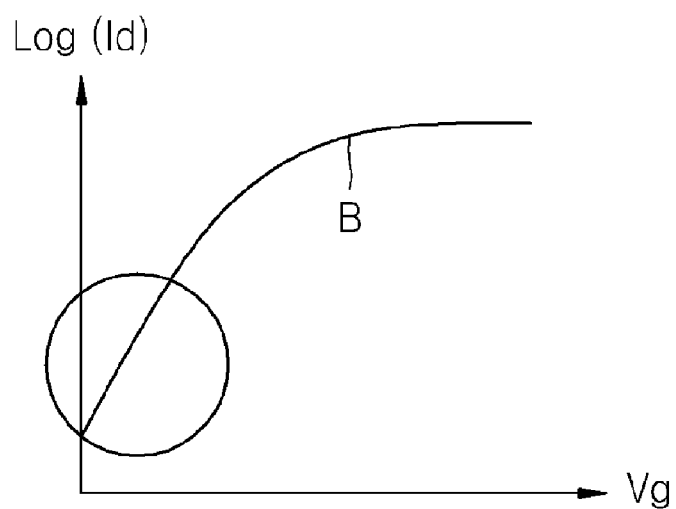
FIG. 10B is a graph showing a threshold voltage distribution of the STI structure of FIG. 10A.

FIG. 10B is a graph showing the threshold voltage distribution of the transistors formed in the STI structure of FIG. 10A. Referring to a circled region of FIG. 10B, a threshold voltage of the transistors formed in the STI structure is significantly reduced.

Figure 11A:
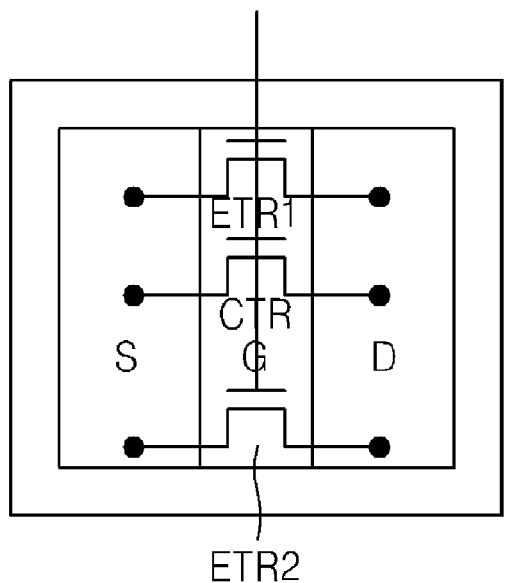
FIG. 11A illustrates cell transistors formed in the STI structure in FIG. 10A.

FIG. 11A illustrates cell transistors formed in the STI structure in FIG. 10A. FIG. 11A illustrates cell transistors ETR1 and ETR2 that are formed at edges, and a cell transistor CTR that is formed at a center portion.

Figure 11B:
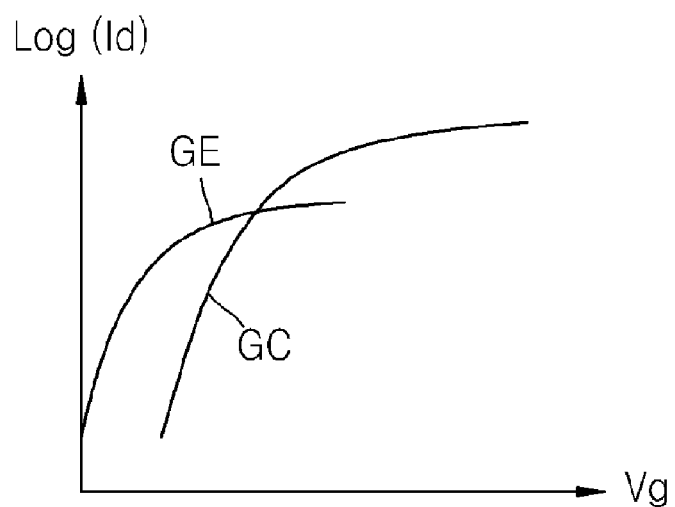
FIG. 11B is a graph showing threshold voltage distributions of the cell transistors of FIG. 11A.

FIG. 11B is a graph showing threshold voltage distributions of the cell transistors CTR, ETR1 and ETR2 of FIG. 11A. In the graph of FIG. 11B, a curve GE indicates the threshold voltage distribution of the cell transistors ETR1 and ETR2 formed at the edges, and a curve GC indicates the threshold voltage distribution of the cell transistor CTR formed at the center portion. In this regard, it can be seen that the threshold voltage distribution of the cell transistors ETR1 and ETR2 formed at the edges (curve GE) is lower than the threshold voltage distribution of the cell transistor CTR formed at the center portion (curve GC).

Figure 12A:
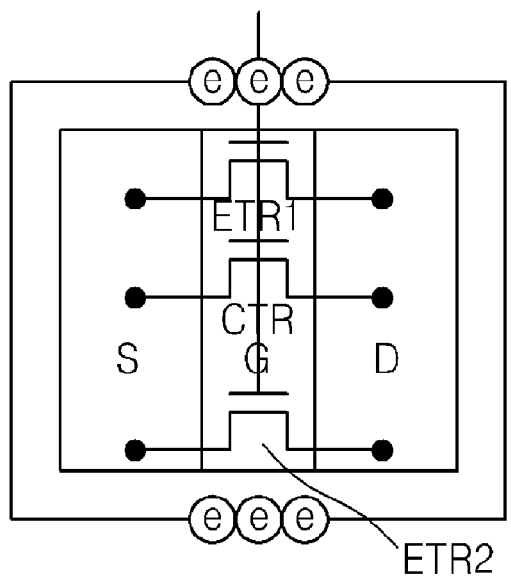
FIG. 12A illustrates the cell transistors after a threshold voltage distribution reducing method is applied thereto, according to another embodiment of the inventive concepts.

FIG. 12A illustrates the cell transistors CTR, ETR1 and ETR2 after a threshold voltage distribution reducing method is applied thereto, according to another embodiment of the inventive concepts.

Referring to FIG. 12A, electrons are injected to the trap region 920 (see FIG. 8) of the nitride liner 910 (see FIG. 8) of the cell transistors ETR1 and ETR2 formed at the edges. Thus, a threshold voltage of the cell transistors ETR1 and ETR2 formed at the edges is increased.

Figure 12B:
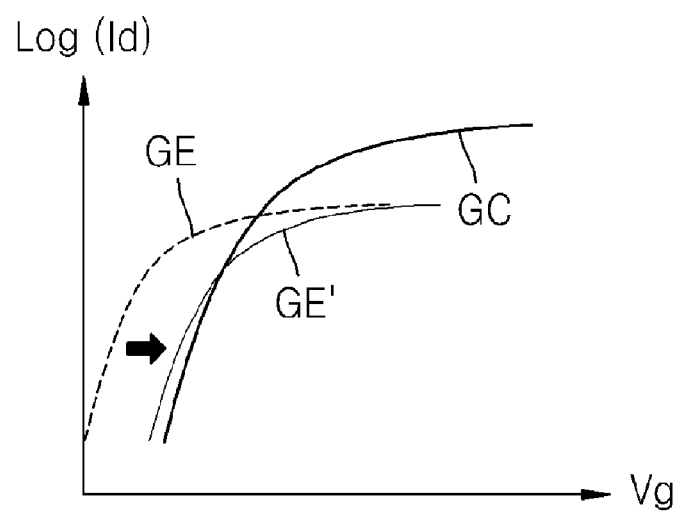
FIG. 12B is a graph showing threshold voltage distributions of the cell transistors in FIG. 12A.

FIG. 12B is a graph showing threshold voltage distributions of the cell transistors CTR, ETR1 and ETR2 in FIG. 12A.

In FIG. 12B, a dotted-line curve GE indicates the threshold voltage distribution of the cell transistors ETR1 and ETR2 to which electrons are not injected (refer to FIG. 11B), and a solid line curve GE' indicates the threshold voltage distribution of the cell transistors ETR1 and ETR2 to which electrons are injected. In this regard, it can be seen that the threshold voltage distribution of the cell transistors ETR1 and ETR2 to which electrons are injected is higher than the threshold voltage distribution of the cell transistors ETR1 and ETR2 to which the electrons are not injected.

Since hot electrons are mainly generated in a transistor having a low threshold voltage, the threshold voltage distribution of the transistors may be improved.

In other words, assuming that the distribution of a threshold voltage of a cell transistor occurs due to a level of a boron segregation significantly varies according to transistors, a self-regulating function (i.e., a function to increase a threshold voltage again by frequently injecting electrons to a transistor of which the threshold voltage is reduced) according to the one or more embodiments of the inventive concepts involves compensating for the threshold voltage of the transistor of which the level of the boron segregation is significant. By doing so, the threshold voltage of the transistor is increased so that the distribution of the threshold voltage is improved.

While the inventive concept has been particularly shown and described with reference to exemplary embodiments thereof, it will be understood that various changes in form and details may be made therein without departing from the spirit and scope of the following claims.

What is claimed is:

1. A method for reducing a threshold voltage distribution in transistors of a semiconductor memory device, each transistor including a nitride liner, the method comprising:
    injecting electrons into a charge trap inside and outside the nitride liner of the transistors; and
    partially removing the electrons injected into the charge trap inside and outside the nitride liner to equalize the quantity of trapped charges in the transistor;
    wherein partially removing the electrons comprises irradiating the transistors with ultraviolet (UV) rays or heating the transistors.

2. The method of claim 1, wherein the injecting of the electrons comprises injecting channel initiated secondary electrons (CHISELs) or injecting gate-induced drain leakage (GIDL) induced secondary electrons (GISELs).

3. The method of claim 1, wherein the injecting of the electrons comprises using hot electron injection or Fowler-Nordheim (FN) electron injection.

4. The method of claim 1, wherein the injecting of the electrons and the partial removal of the electrons are performed in an electrical die sorting (EDS) process during manufacturing of the semiconductor memory device.

5. The method of claim 1, wherein the transistors are disposed in at least one of a core region and a peripheral region of the semiconductor memory device.

* * * * *